United States Patent [19]

Rilly

[11] 4,296,360

[45] Oct. 20, 1981

[54] SWITCHED-MODE FRAME-SCAN CONTROL CIRCUIT FOR A VIDEOFREQUENCY RECEIVER

[75] Inventor: Gérard Rilly, Paris, France

[73] Assignee: Thomson-Brandt, Paris, France

[21] Appl. No.: 156,462

[22] Filed: Jun. 4, 1980

[30] Foreign Application Priority Data

Jun. 7, 1979 [FR] France .................... 79 14590

[51] Int. Cl.³ .................. H01J 29/70; H01J 29/72
[52] U.S. Cl. .................................. 315/387; 315/408
[58] Field of Search ................. 315/387, 388, 408

[56] References Cited
U.S. PATENT DOCUMENTS 4,218,638  8/1980  Breithaupt .................... 315/397

Primary Examiner—Theodore M. Blum
Attorney, Agent, or Firm—Cushman, Darby & Cushman

[57] ABSTRACT

This circuit comprises a saw-tooth signal generating circuit having a single active switch monodirectional in voltage and bidirectional in current, controlled by a cyclic ratio control circuit connected, on the one hand, to a static servo-control circuit so as to ensure optimum operation of the active-switch circuit and, on the other hand, to a dynamic servo-control circuit so as to ensure conformity of the law of variation of the current in the deflector with respect to an S-corrected frame saw-tooth law.

Such a circuit is used in transistorized videofrequency receivers.

8 Claims, 5 Drawing Figures

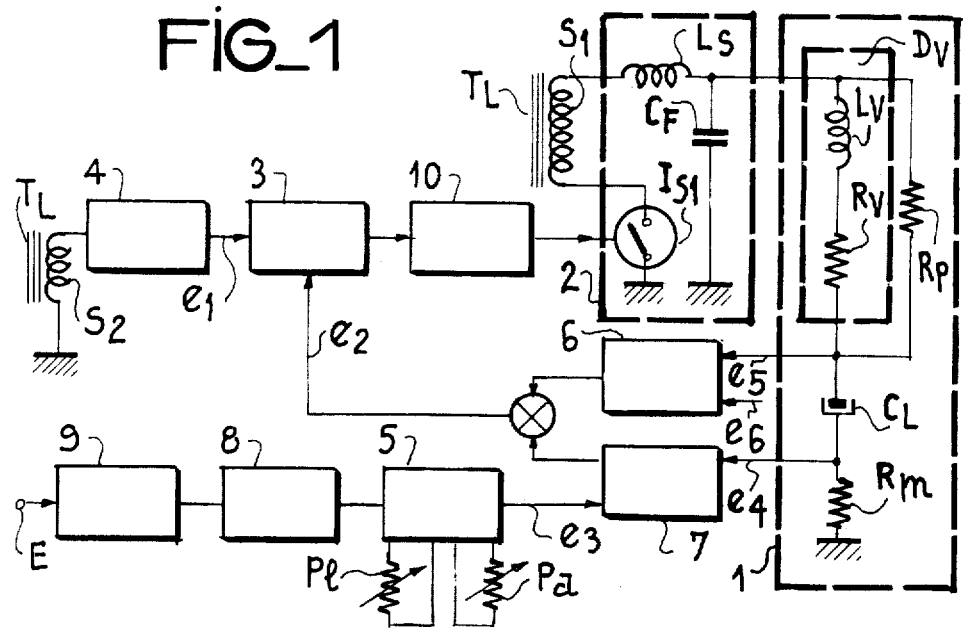
FIG_1
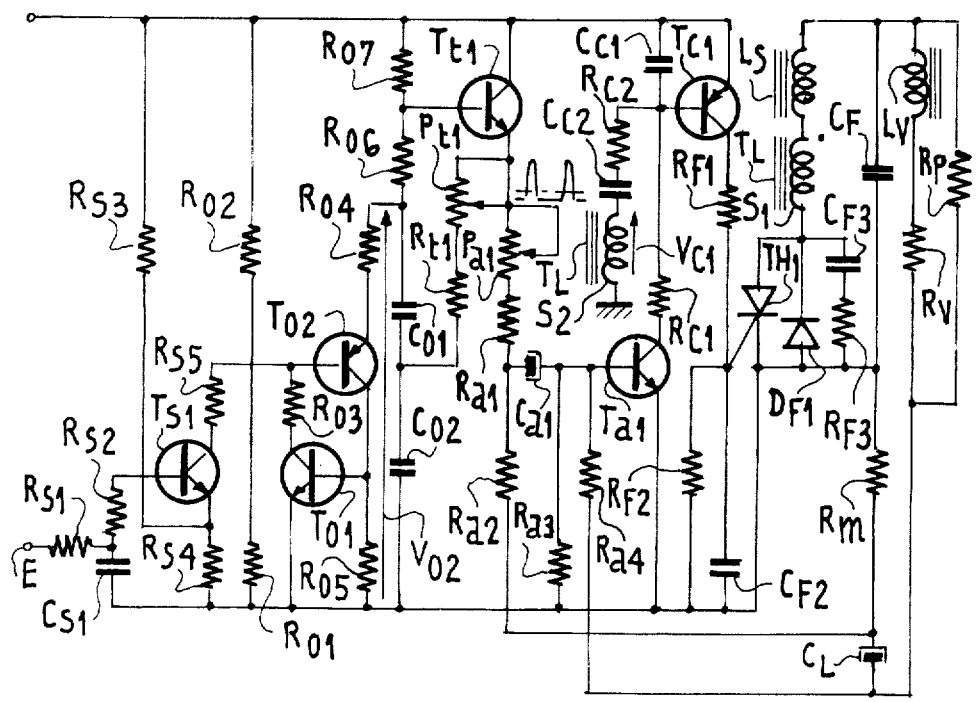
FIG_2

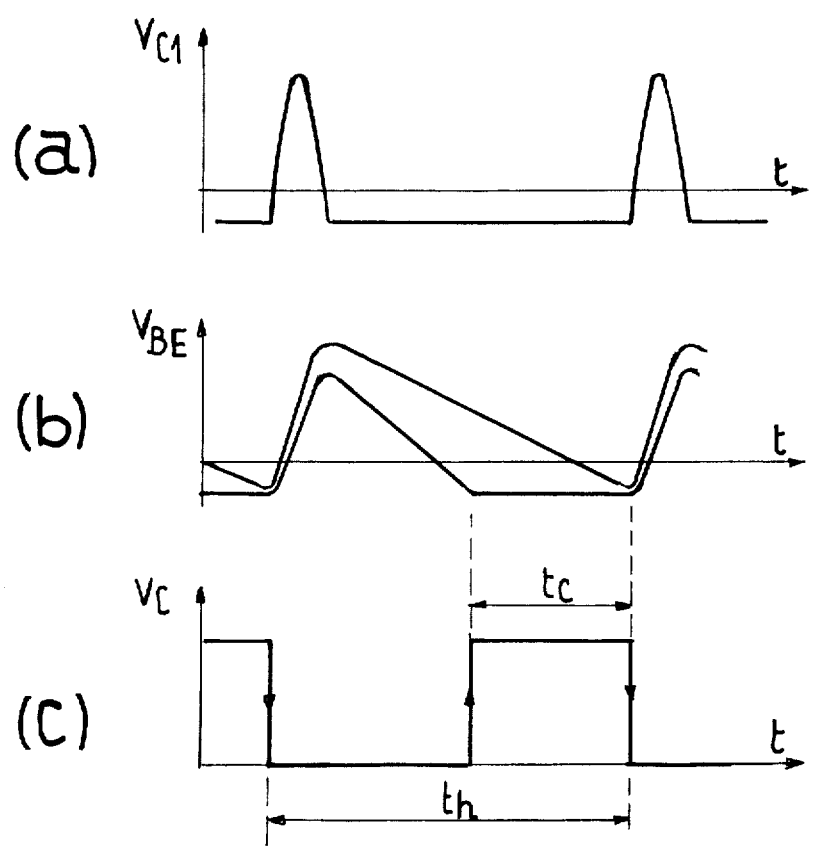
FIG_3

SWITCHED-MODE FRAME-SCAN CONTROL CIRCUIT FOR A VIDEOFREQUENCY RECEIVER

BACKGROUND OF THE INVENTION

The invention relates to a switched-mode frame-scan control circuit used in particular in television receivers.

The vertical movement of the spot on the screen of a cathode-ray tube is provided by coils, called vertical-deflection or frame-scan coils, through which flows a current generally in saw-tooth form. In the case of the French standard, this current has a period of 20 milliseconds and a frame scan return time less than 1 ms.

In the prior art, this current is generated by means of electronic devices comprising generally a disabled oscillator supplying a saw-tooth voltage synchronized with the frame frequency, a connecting stage with high input impedance and low output impedance, and an output stage supplying to the vertical deflection coils the current having the amplitude and shape required for vertical deflection of the spot of the cathode-ray tube. This output stage may be a class A biased power amplifier, or else a complementary-symmetry or class AB biased "push-pull" amplifier.

Chopper devices, provided with active switches such as thyristors, are also used for generating the frame-scan current.

In this case, one of the active switches ensures the vertical scan of the upper half of the screen, by charging a capacitor connected in parallel with the vertical deflection winding by means of voltage pulses of decreasing width in time and of a given polarity.

The second switch ensures the vertical scan of the lower half of the screen, by charging the condenser by means of voltage pulses of decreasing width in time and of a polarity opposite the preceding one.

The discharge of this condenser causes in fact a saw-tooth current to flow through the vertical deflection winding.

The two paths of these chopper devices are monodirectional in current flow, each in a different direction.

The French patent application filed under the No. 78/22266 on July 27, 1978, in the name of the applicant proposes a single-path chopper device, i.e. a single active switch.

In fact, for this the vertical deflector is connected in series with a measuring resistance and a connecting capacitor whose value is sufficiently high for the voltage at the terminals of the unit thus formed to keep the same polarity whatever the direction of the current flowing through the vertical deflector. This unit then behaves sometimes as generator, sometimes as a receiver, and is connected to a circuit for generating a saw-tooth signal from the line-scan return signal, monodirectional in voltage and bidirectional in current, controlled by a control circuit synchronized to the line frequency.

In accordance with the previously mentioned French patent application No. 78/22266, the active switch is enabled during the outward line scan, the time when it starts to conduct defining the current flowing through the deflector.

SUMMARY OF THE INVENTION

The present invention proposes, so as to obtain for such a single-path chopper device stable amplitude and linearity of the image despite the drift and non-linearity shortcomings of the electronic components, elaborating a simple and efficient servo-control system.

In fact, the switched-mode frame-scan control circuit of the invention comprises a circuit for generating a saw-tooth signal with an active switch monodirectional in voltage and bidirectional in current, connected to the terminals of a load comprising the vertical deflector in series with a measuring resistance and a connecting capacitor, and is characterized in that the active switch is controlled by a cyclical ratio control circuit connected, on the one hand, to a static servo-control circuit one input terminal of which is connected to the positive terminal of the connecting capacitor and the other terminal to a reference DC voltage generator, so as to maintain a sufficiently high and stable voltage at the terminals of this capacitor for optimum operation of the active switch circuit and, on the other hand, to a dynamic servo-control circuit one input terminal of which is connected to the measuring resistance and the other input terminal to a generator of frame saw-teeth corrected into an S, so as to ensure conformity of the law of variation of the current in the deflector with respect to this corrected frame saw-tooth law; these two servo-control circuits taking effect on the moment when the active switch is energized.

DESCRIPTION OF THE DRAWINGS

Other characteristics and advantages of the invention will become clear from the following description, given by way of non-limiting example and illustrated by the accompanying figures in which:

FIG. 1 is a block diagram of a switched-mode frame-scan circuit comprising a control circuit in accordance with the invention;

FIG. 2 is a diagram of one embodiment of the switched-mode frame-scan control circuit of the invention;

FIGS. 3a, b and c are graphical representations of different voltages measured on the circuit shown in FIG. 2.

DESCRIPTION OF THE PREFERRED EMBODIMENTS

FIG. 1 shows a block diagram of a switched-mode frame-scan circuit.

Load 1 comprises the vertical deflector $D_v$ protected by a parallel resistor $R_p$, a connecting capacitor $C_L$ and a measuring resistor $R_m$.

The value of capacitor $C_L$ is chosen so as to have at its terminals a sufficiently high voltage, such as described in the above-mentioned patent application No. 78/22266, so as to obtain at the terminals of the load a positive voltage whatever the direction of the current through the deflector. The load behaves then in a first stage as a receiver of energy and in a second stage as a generator.

This load 1 is connected to the terminals of a circuit 2 generating a saw-tooth signal.

This circuit 2 generates in the vertical deflector $D_v$ a saw-tooth signal from line-scan return signals.

In fact, during the scan return, there appears in the secondary windings of the line transformer a periodic alternating signal at the line frequency.

The saw-tooth current is obtained by chopping this alternating signal generated in a secondary winding of the line transformer $T_L$. This chopping is effected by means of an active switch $I_{S1}$ bidirectional in current and monodirectional in voltage, connected in series with the secondary winding $S_1$ of transformer $T_L$, as well as with an inductance $L_S$ not coupled to the line transformer, the whole being mounted in parallel with a filtering capacitor $C_f$.

The value of capacitor $C_f$ is chosen sufficiently high for the alternating part of the voltage at its terminals to be very small with respect to the signal at the terminals of winding $S_1$, and so negligible.

Another secondary winding $S_2$ of the line transformer is connected to the input of a line saw-tooth generating circuit 4. This circuit 4 supplies from the signal available at the terminals of winding $S_2$ a saw-tooth signal during the outward travel of the line scan.

This saw-tooth signal is injected into an input $e_1$ of a cyclic ratio control circuit 3, which delivers a rectangular signal at the input of an interface circuit 10 whose output is connected to the control electrode of the active switch $I_{S1}$.

This interface circuit enables the rectangular control signal available at the output of the cyclic ratio control circuit 3 to be adapted with respect to the electrical characteristics of active switch $I_{S1}$.

The leading edge of the rectangular signal corresponding to the moment when active switch $I_{S1}$ is closed.

Now, the position of this leading edge, and so the moment when active switch $I_{S1}$ is closed, depend on the signal applied to the input $e_2$ of the cyclic ratio control circuit.

As was described in patent application No. 78/22266, the more active switch $I_{S1}$ is triggered in advance of the moment when the line return begins, the more the average current in inductance Ls decreases with respect to its maximum value corresponding to the case when the active switch is still disabled.

It is thus possible to control the value of the average current in inductance Ls, so the value of the current in deflector Dv by controlling the moment when active switch $I_{S1}$ is closed. During the outward travel of the frame scan, so that the current in vertical deflector $D_y$ follows a frame saw-tooth law, it is sufficient then to suitably control the successive moments when active switch $I_{S1}$ is closed.

This suitable control will be ensured by the signal applied to the input $e_2$ of the cyclic ratio control circuit 3.

This signal comes, on the one hand, from a dynamic servo-control circuit 7 the input $e_4$ of which is connected to the terminals of measuring resistor $R_m$ and the input $e_3$ to a corrected saw-tooth generating circuit 5.

The voltage of the terminals of Rm depends on the current flowing through vertical deflector $D_y$. The servo-control circuit 7 supplies then an error signal depending on the difference between the vertical deflection current and the corrected saw-tooth voltage.

A frame-separator circuit 9 receives at its input E the complete synchronizing signals taken from the video signal, and after integration and clipping delivers a frame-synchronization signal.

This frame-synchronization signal is applied to the input of an oscillator circuit 8. This latter drives the circuit generating the corrected saw-teeth whose form prefigures the current required in the vertical deflector coil $D_y$. There is in general available at this level a linearity and amplitude adjustment, symbolized by the potentiometers $P_L$ and $P_a$.

The input $e_2$ of cyclic ratio control circuit 3 is moreover connected to a static servo-control circuit 6 which ensures the maintenance and the monitoring of the average voltage at the terminals of connecting capacitor $C_L$ with respect to a reference defined so as to ensure correct and optimum operation of the switched-mode frame-scan circuit.

FIG. 2 shows one simple embodiment of a frame-scan control circuit in accordance with the invention.

The complete synchronization signals taken from the video signal are applied to input E.

The frame-separator circuit is formed, on the one hand, from an integrator stage $R_{S1}$, $C_{S1}$ and $R_{S2}$ mounted in T and, on the other hand, a transistor $T_{S1}$ biased by resistors $R_{S3}$ and $R_{S4}$.

The input E is effected on a terminal of resistor $R_{S1}$, and the base of transistor $T_{S1}$ is connected to a terminal of resistor $R_{S2}$.

Resistors $R_{S3}$ and $R_{S4}$ cause emitter biasing creating the threshold for triggering transistor $T_{S1}$.

When the synchronization signal applied to input E characterizes the frame-synchronization signal, transistor $T_{S1}$ passes from a disabled state to a saturated state.

The collector of transistor $T_{S1}$ is connected through a resistor $R_{S5}$ to the input of an oscillator circuit.

This oscillator circuit comprises two transistors $T_{O1}$ and $T_{O2}$ operating simultaneously in disabled or saturated states.

When these two transistors $T_{O1}$ and $T_{O2}$ are saturated (frame return), with the collector-emitter voltage practically zero, the voltage $V_{O1}$ at the terminals of resistor $R_{O1}$ is small. The current then flowing through resistors $R_{O7}$, $R_{O6}$, $R_{O4}$ connected in the emitter circuit of transistor $T_{O2}$, must then be insufficient to maintain the saturated state of the two transistors $T_{O1}$, $T_{O2}$. Thus, when capacitors $C_{O1}$ and $C_{O2}$ are sufficiently discharged, transistors $T_{O1}$ and $T_{O2}$ are disabled. Voltage $V_{O1}$ passes then suddenly from a low value to a higher value, this value being imposed by the divider bridge formed by resistors $R_{O1}$ and $R_{O2}$.

Resistors $R_{O7}$ and $R_{O6}$ ensure the charging of capacitors $C_{O1}$ and $C_{O2}$ until the moment when transistor $T_{O2}$ becomes saturated again.

The frequency of the oscillator thus obtained, if resistor $R_{S5}$ is disconnected, is slightly less than the frame frequency, i.e. 50 Hz.

At the moment of the frame-synchronization signal, with transistor $T_{S1}$ becoming saturated and transistors $T_{O1}$ and $T_{O2}$ being disabled, voltage $V_{O1}$ drops to assume a value depending on resistor $R_{S5}$. For transistors $T_{O1}$ and $T_{O2}$ to pass to the saturated state, voltage $V_{O2}$ at the terminals of series capacitors $C_{O1}$ and $C_{O2}$ must at this same moment become greater than the voltage $V_{O1}$ at the terminals of resistor $R_{O1}$.

The saturation pulse delivered by the collector of transistor $T_{S1}$ will only be taken into account for a certain part of the period of the oscillator corresponding to the end of charging of capacitors $C_{O1}$ and $C_{O2}$, i.e. when the charging voltage is greater than voltage $V_{O1}$.

This enables the immunity of the oscillator to be improved in part with respect to the parasite pulses causing saturation of transistor $T_{S1}$.

This oscillator circuit is connected to a buffer circuit comprising transistor $T_{t1}$, resistor $R_{t1}$ and potentiometer $P_{t1}$.

The voltage $V_{O2}$ at the terminals of capacitors $C_{O1}$ and $C_{O2}$ varies in accordance with an approximate sawtooth law.

Since the resistance of resistor $R_{O7}$ is very high, transistor $T_{t1}$ whose base is connected to the junction point of the two resistors $R_{O7}$ and $R_{O6}$, forms an impedance-lowering stage, so as to connect between the emitter of transistor $T_{t1}$ and the common connection point of capacitors $C_{O1}$ and $C_{O2}$, the network comprising a resistor $R_{t1}$ in series with a potentiometer $P_{t1}$.

Thus there is added to the saw-tooth voltage available at the terminals of series capacitors $C_{O1}$ and $C_{O2}$, a parabolic voltage due to $P_{t1}$, $P_{t1}$ and to capacitor $C_{O2}$.

Thus there is obtained at $V_{t2}$ between the emitter of transistor $T_{t1}$ and ground a voltage in the form of saw-teeth corrected to an S corresponding to the law of the current required in frame deflector $D_y$.

Thus there is obtained at output $V_{t1}$ the corrected saw-tooth signal required for the dynamic servo-control circuit of the invention which will be described further on.

The cyclic ratio control circuit of the invention only comprises a single active stage, the switching-biased transistor $T_{c1}$.

This transistor $T_{c1}$ has its base connected to a circuit for generating line saw-teeth from the line return signal.

In fact, the circuit formed by capacitor $C_{c2}$ in series with resistor $R_{c2}$ and capacitor $C_{c1}$ forms an integrator transforming the line-scan return voltage $V_{c1}$, shown in FIG. 3a, taken from the winding $S_2$ of line transformer $T_L$, into a triangular signal.

This triangular signal available between the base and the emitter of transistor $T_{c1}$ is shown in FIG. 3b.

The collector of transistor $T_{c1}$ is connected through an interface circuit ($R_{f1}$; $R_{f2}$, $C_{f2}$) for matching to the gate of a thyristor $TH_1$ forming with diode $D_{f1}$ and resistor $R_{f3}$ in series with capacitor $C_{f3}$, the active switch $I_{S1}$.

In fact, in accordance with FIG. 1, the vertical deflector formed from inductance $L_v$ and series resistor $R_v$, protected by resistor $R_p$, is connected in series with the connecting capacitor $C_L$ and measuring resistor $R_m$.

The load thus formed is connected in parallel with the saw-tooth signal generator comprising capacitor $C_f$ connected in parallel with the inductance, the unit formed from inductance $L_S$ in series with winding $S_1$ of line transformer $T_L$ and the active switch $TH_1$, $D_{f1}$, $C_{f3}$ and $R_3$.

The cathode of diode $D_{f1}$ is connected to the anode of thyristor $TH_1$ and to a terminal of winding $S_1$. The anode of this diode $D_{f1}$ is connected to the cathode of the thyristor and to a terminal of capacitor $C_f$.

This thyristor $TH_1$ operates as a switch, when its gate current is sufficient for it to be conducting, it short-circuits diode $D_{f1}$.

This active switch is bidirectional in current and monodirectional in voltage, for in fact when it is closed, it may have flowing therethrough currents in opposite directions and when it is open it has at its terminals a voltage of given polarity corresponding to the inverse voltage of diode $D_{f1}$.

The form of the current in the vertical deflector is linked to the moment when this active switch is closed such as this is described in patent application No. 78/22266 filed in the name of the applicant.

The dynamic servo-control circuit is formed by resistor $R_{a2}$ one terminal of which is connected to resistor $R_m$ and the other to resistor $R_{a1}$ in series with potentiometer $P_{a1}$, capacitor $C_{a1}$ and transistor $T_{a1}$.

Potentiometer $P_{a1}$ receives at one of its terminals the corrected saw-tooth signal available at the emitter of $T_{t1}$.

The emitter of transistor $T_{a1}$ is connected to ground and its collector to the base of transistor $T_{c1}$ through a resistor $R_{c1}$.

The direction of the current in the frame deflector is such that, during the outward travel of the frame scan, the voltage at the terminals of measuring resistor $R_m$ is in phase opposition with the corrected saw-tooth voltage $V_{t1}$. The corrected saw-tooth voltage is then compared with the voltage at the terminals of measuring resistor $R_m$ by the resistor bridge $R_{a2}$, $R_{a1}$, $P_{a1}$.

Transistor $T_{a1}$ amplifies the possible dynamic error signal between the voltage at the terminals of resistor $R_m$ and the correct saw-tooth voltage.

Since the voltage at the terminals of $R_m$ depends on the current flowing through the vertical deflector, the error signal depends then on the difference between the vertical deflection current and the corrected saw-tooth voltage.

This error signal is then found again in the collector circuit of transistor $T_{a1}$.

Moreover, the static servo-control is obtained by resistors $R_{a4}$, $R_{a3}$ and the same transistor $T_{a1}$.

The reference voltage is the base voltage threshold of transistor $T_{a1}$ fixed by resistor $R_{a3}$.

The base of transistor $T_{a1}$ is connected through a resistor $R_{a4}$ to the positive terminal of the electrochemical capacitor $C_L$. If the average voltage at the terminals of capacitor $C_L$ tends to increase, the base current of transistor $T_{a1}$ increases and so its collector current as well.

This increase of the collector current causes an increase of the duration in the saturated state of transistor $T_{c1}$ of the cyclic ratio control circuit and an advance in the triggering of thyristor $TH_1$ causing thereby a reduction in the mean voltage of capacitor $C_L$.

In fact, in the absence of a collector current of transistor $T_{a1}$, capacitors $C_{c1}$ and $C_{c2}$ take on a mean charge sufficient to maintain transistor $T_{c1}$ disabled. And when a DC current appears in the collector circuit of transistor $T_{a1}$, the combination of this current with that due to the line saw-tooth generating circuit ($C_{c2}$, $R_{c2}$, $C_{c1}$) causes the saturating of transistor $T_{c1}$ during the end of the outward travel of the line scan.

There is then obtained at the collector of transistor $T_{c1}$ a square-wave signal such as shown in FIG. 3c.

The conduction time of transistor $T_{c1}$, i.e. the time $T_c$ of FIG. 3c, depends on the collector current of transistor $T_{a1}$, which modifies the form of the base-emitter control voltage of transistor $T_{c1}$ such as shown in FIG. 3b.

The moment when $TH_1$ begins to close corresponds to the leading edge of the square-wave signal available at the collector output of transistor $T_{c1}$.

Furthermore, resistor $R_{c1}$ serves to limit the collector current of transistor $T_{a1}$ and the base current of transistor $T_{c1}$ when transistor $T_{a1}$ tends to be saturated in the case of accidental phenomena.

The gain of the transistor is chosen so that, during the outward travel of the frame scan, the variation of the base voltage of $T_{a1}$ is negligible with respect to the corrected saw-tooth alternating voltage and the voltage at the terminals of resistor $R_m$. The alternating current flowing through capacitor $C_{a1}$ is then small with respect to the current flowing through the resistor bridge $P_{a1}+R_{a1}$, $R_{a2}$. The law of variation of the voltage at the terminals of resistor $R_m$ is then the same as the corrected saw-tooth voltage except for the sign since they are in phase opposition.

The dynamic servo-control thus achieved is such that the current flowing through the deflector is the image of the corrected saw-tooth voltage.

And furthermore, the proper operation of the output stage when switching is ensured by the previously described static servo-control.

This single-active-switch frame-scan control circuit has then the advantage of having a simplified and servo-controlled cyclic ratio control circuit.

This control circuit for switched-mode frame scanning in accordance with the invention is principally used in transistorized television receivers.

I claim:

1. A switched-mode frame-scan control circuit comprising a circuit for generating a saw-tooth signal having an active switch monodirectional in voltage and bidirectional in current, connected to the terminals of a load comprising the vertical deflector in series with a measuring resistor and a connecting capacitor, wherein the active switch is controlled by a cyclic ratio control circuit connected, on the one hand, to a static servo-control circuit one input terminal of which is connected to the positive terminal of the connecting capacitor and the other input terminal to a reference DC voltage generator, so as to maintain a sufficiently high and stable voltage at the terminals of this capacitor for optimum operation of the active-switch circuit and, on the other hand, to a dynamic servo-control circuit one input terminal of which is connected to the measuring resistor and the other input terminal to a circuit for generating frame saw-teeth corrected into an S, so as to ensure conformity of the law of variation of the current in the deflector with respect to this corrected frame saw-tooth law; these two servo-control circuits taking effect on the moment when the active switch is triggered.

2. The frame-scan control circuit as claimed in claim 1, wherein the cyclic ratio control circuit comprises a switching transistor receiving at its base, on the one hand, a synchronizing line saw-tooth signal and, on the other hand, the correction signals coming from the static and dynamic servo-control circuits, its collector being connected to the control electrode of the active switch.

3. The frame-scan control circuit as claimed in claim 2, wherein the active switch comprises a thyristor whose anode is connected to the cathode of a diode and the cathode to the anode of this same diode, the gate of this thyristor being connected through an interface shaping circuit to the collector of the transistor of the cyclic ratio control circuit.

4. The frame-scan control circuit as claimed in claim 3, wherein the interface shaping circuit comprises a resistor one terminal of which is connected to the collector of the transistor of the cyclic ratio control circuit and the other is connected, on the one hand, to a terminal of a network comprising a resistor in parallel with a capacitor whose other terminal is to ground and, on the other hand, to the gate of the thyristor.

5. The frame-scan control circuit as claimed in one of claims 1 to 4, wherein the static servo-control circuit comprises a servo-control transistor receiving at its base, on the one hand, an error signal coming from the difference between a reference voltage and the voltage at the terminals of the connecting capacitor and, on the other hand, the error signal from the dynamic servo-control circuit comprising two resistors in series, one of these resistors being connected to the corrected frame saw-tooth generating circuit, the other to the measuring resistor, and their common connection point through a capacitor to the base of the servo-control transistor whose collector is connected to the input of the cyclic ratio control circuit.

6. The frame-scan control circuit as claimed in claim 5, wherein the reference voltage of the static servo-control circuit is fixed by a resistor connected between the base of the servo-control transistor and ground.

7. The frame-scan control circuit as claimed in claim 5 or 6, wherein the collector circuit of the servo-control transistor comprises a resistor for protecting against unduly high variations of the collector current of this servo-control transistor.

8. A videofrequency receiver, equipped with a switched-mode frame-scan control circuit as claimed in one of claims 1 to 7.

* * * * *